US006924077B2

(12) United States Patent
Delp et al.

(10) Patent No.: US 6,924,077 B2
(45) Date of Patent: Aug. 2, 2005

(54) COLORED INSCRIPTION AND MARKING OF PLASTICS AND SURFACE COATINGS

(75) Inventors: Reiner Delp, Darmstadt (DE); Matthias Kuntz, Seeheim-Jugenheim (DE)

(73) Assignee: Merck Patent GmbH, Darmstadt (DE)

(*) Notice: Subject to any disclaimer, the term of this patent is extended or adjusted under 35 U.S.C. 154(b) by 158 days.

(21) Appl. No.: 10/202,838

(22) Filed: Jul. 26, 2002

(65) Prior Publication Data

US 2004/0013969 A1 Jan. 22, 2004

(30) Foreign Application Priority Data

Jul. 27, 2001 (DE) ........................................ 101 36 479

(51) Int. Cl.[7] .................................................. G03F 7/00

(52) U.S. Cl. .................... 430/270.1; 430/338; 430/346; 430/964

(58) Field of Search ................................ 430/346, 338, 430/964, 270.1

(56) References Cited

U.S. PATENT DOCUMENTS

| | | | | | |
|---|---|---|---|---|---|
| 5,075,195 A | * | 12/1991 | Babler et al. | ............... | 430/200 |
| 5,350,792 A | * | 9/1994 | Hess et al. | .................. | 524/417 |
| 5,489,639 A | * | 2/1996 | Faber et al. | ................ | 524/417 |
| 5,667,580 A | * | 9/1997 | Babler | ........................ | 106/499 |
| 5,928,780 A | * | 7/1999 | Schmidt et al. | ............. | 428/331 |
| 6,207,240 B1 | * | 3/2001 | Schoenfeld et al. | ........ | 427/555 |
| 6,214,917 B1 | * | 4/2001 | Linzmeier et al. | .......... | 524/430 |
| 6,372,819 B1 | * | 4/2002 | Mizobuchi et al. | ......... | 523/161 |
| 6,376,577 B2 | * | 4/2002 | Kniess et al. | ............... | 523/215 |
| 6,521,688 B1 | * | 2/2003 | Linzmeier et al. | .......... | 524/430 |
| 6,680,121 B2 | * | 1/2004 | Sakoske et al. | ............. | 428/409 |
| 6,693,657 B2 | * | 2/2004 | Carroll et al. | ............. | 347/224 |

FOREIGN PATENT DOCUMENTS

| | | |
|---|---|---|
| EP | 0522370 A1 | 6/1992 |
| EP | 0684144 B1 | 11/1995 |

OTHER PUBLICATIONS

English Abstract of EPO 0 684 144 B1.

* cited by examiner

*Primary Examiner*—Amanda Walke
(74) *Attorney, Agent, or Firm*—Millen, White, Zelano, Branigan, P.C.

(57) ABSTRACT

The present invention relates to the colored inscription or marking of plastics and surface coatings, including powder coatings, in which a colorant is transferred into the plastic or surface coating by laser radiation with the aid of a laser light-absorbent substance.

20 Claims, No Drawings

COLORED INSCRIPTION AND MARKING OF PLASTICS AND SURFACE COATINGS

The present invention relates to the colored inscription or marking of plastics and surface coatings, including powder coatings, in which a colorant is transferred into the plastic or surface coating by laser radiation with the aid of a laser light-absorbent substance.

The labelling of production goods is becoming of increased importance in virtually all sectors of industry. Thus, it is frequently necessary to apply, for example, production data, expiry dates, bar codes, company logos, serial numbers, etc., to products. At present, these markings are predominantly carried out by means of conventional techniques, such as printing, embossing, stamping and application of labels. With the aid of a laser beam, it is possible, in particular in the infrared region, to apply inscriptions to glass, metal and ceramic. In this case, the materials of which the later inscription consists are melted on the surface. However, this process is not suitable for the inscription of plastics. Dark marking of plastics using lasers is of increasing importance. This technique allows graphic inscriptions, such as, for example, bar codes, to be applied at high speed, even to a non-planar surface. Since the inscription is located in the plastic article itself, it is durably resistant to abrasion.

Besides the dark marking of plastics, there is increasing interest in colored markings.

Absorber materials for the colored marking of plastics are known. Colored laser marking of a dark plastic is disclosed in EP 0 522 370 A1. Thus, EP 0 684 144 B1 describes a dopant for the colored marking of plastic materials which is distinguished by the fact that it comprises a mixture of an opacifier and a chromogenic substance.

However, the processes known from the prior art for the colored inscription of plastics have the disadvantage that they do not enable a colored marking to be obtained on plastics having a pale color or a plurality of lasers having different wavelengths are required for the colored inscription of the plastic.

An object of the present invention was therefore to find a process which enables colored marking of high contrast on any plastic color using laser light of only one laser or laser wavelength.

Upon further study of the specification and appended claims, further objects and advantages of this invention will become apparent to those skilled in the art.

Surprisingly, it has been found that plastics and surface coatings can be inscribed in color if the surface of a laser-markable plastic or surface coating is covered with a mixture of colorant and absorber substance and the latter is introduced into the surface over part or all thereof by application of laser energy. The colorant is introduced, in combination with the laser light-absorbent substance, into the portions of the plastic or coating surface which have been melted by laser irradiation. Due to the introduction into the surface of the plastic or coating, colored inscriptions with very high abrasion resistance can be achieved.

The invention relates to plastics and surface coatings which can be provided with a colored inscription or marking, characterised in that a mixture consisting of one or more colorants and one or more substances which absorb laser light is applied to the plastic or coating surface.

Good marking results are achieved if the colorant/laser light-absorbent substance ratio is from 100:10 to 10:100, preferably from 95:5 to 20:80, in particular from 90:10 to 30:70.

However, the concentration of the colorant and laser light-absorbent substance on the surface of the plastic or coating is dependent on the plastic system employed or on the surface coating composition and on the area of the inscription.

Suitable colorants for the inscription are both organic and inorganic colorants. Suitable colorants are all those known to the person skilled in the art which do not decompose on laser irradiation.

Suitable organic colorants are preferably those selected from the group consisting of the following organic pigments:

copper phthalocyanines, dioxazines, anthraquinones, monoazo and diazo pigments, diketopyrrolopyrrole, polycyclic pigments, anthrapyrimidines, quinacridones, quinaphthalones, perinones and perylenes.

Suitable dyes as colorants include, for example, acridines, azo dyes, phthalocyanines, xanthenes and phenazines. The dyes may be cationic, anionic or nonionic dyes.

Suitable inorganic colorants are, for example, colored oxide and oxide hydroxide pigments, oxide mixed-phase pigments, sulfide and sulfide/selenium pigments, carbonate pigments, chromate and chromate/molybdate mixed-phase pigments, complex-salt pigments and silicate pigments.

The colorant can also be a mixture of two or more substances.

The laser light-absorbent substances which are suitable for the marking are preferably based on anthracene, pentaerythritol, copper hydroxide phosphates, molybdenum disulfide, antimony(III) oxide and bismuth oxychloride, platelet-shaped, in particular transparent or semi-transparent substrates comprising, for example, phyllosilicates, such as, for example, synthetic or natural mica, talc, kaolin, glass platelets, $SiO_2$ platelets or synthetic support-free platelets. Also suitable are platelet-shaped metal oxides, such as, for example, platelet-shaped iron oxide, aluminum oxide, titanium dioxide, silicon dioxide, LCPs (liquid crystal polymers), holographic pigments, conductive pigments or coated graphite platelets.

The platelet-shaped pigments employed can also be metal platelets, which can be uncoated or alternatively covered with one or more metal oxide layers; preference is given, for example, to Al, Cr, Fe, Au, Ag and steel platelets. If metal platelets which are susceptible to corrosion, such as, for example, Al, Fe or steel platelets, are employed in uncoated form, they are preferably covered with a protective polymer layer.

Particularly preferred substrates are mica flakes coated with one or more metal oxides. The metal oxides used here are both colorless, high-refractive-index metal oxides, such as, in particular, titanium dioxide, antimony(III) oxide, zinc oxide, tin oxide and/or zirconium dioxide, and colored metal oxides, such as, for example, chromium oxide, nickel oxide, copper oxide, cobalt oxide and in particular iron oxide ($Fe_2O_3$ or $Fe_3O_4$). The particularly preferred absorber material is antimony(III) oxide, alone or in combination with tin oxide.

These substrates are known and for the most part commercially available, for example under the trade name Iriodin® LS from Merck KGaA, and/or can be prepared by standard processes known to the person skilled in the art. Pigments based on transparent or semi-transparent platelet-shaped substrates are described, for example, in the German patents and patent applications 14 67 468, 19 59 998, 20 09 566, 22 14 454, 22 15 191, 22 44 298, 23 13 331, 25 22 572, 31 37 808, 31 37 809, 31 51 343, 31 51 354, 31 51 355, 32 11 602, 32 35 017, 38 42 330 and 44 41 223.

Coated $SiO_2$ platelets are disclosed, for example, in WO 93/08237 (wet-chemical coating) and DE-A 196 14 637 (CVD process).

Multilayered pigments based on phyllosilicates are disclosed, for example, in DE-A 196 18 569, DE-A 196 38 708, DE-A 197 07 806 and DE-A 198 03 550. Multilayered pigments which have the following structure are particularly suitable:

Mica+$TiO_2$+$SiO_2$+$TiO_2$

Mica+$TiO_2$+$SiO_2$+$TiO_2$/$Fe_2O_3$

Mica+$TiO_2$+$SiO_2$+(Sn, Sb)$O_2$ $SiO_2$ platelet+$TiO_2$+$SiO_2$+$TiO_2$

Particularly preferred laser light-absorbent substances are anthracene, pentaerythritol, copper hydroxide phosphates, molybdenum disulfide, antimony(III) oxide and bismuth oxychloride.

The laser light-absorbent substance can also be a mixture of two or more components.

All known thermoplastics and thermosets, as described, for example, in Ullmann, Vol. 15, pp. 457 ff., Verlag VCH, can be inscribed in a durable and abrasion-resistant manner by means of a laser by the process according to the invention. Suitable plastics are, in particular, polyethylene, polypropylene, polyamides, polyesters, polyester-esters, polyether-esters, polyphenylene ether, polyacetal, polybutylene terephthalate, polymethyl methacrylate, polyvinyl acetal, polystyrene, acrylonitrile-butadiene-styrene (ABS), acrylonitrile-styrene-acrylate (ASA), polycarbonate, polyether sulfones and polyether ketones, as well as copolymers and/or mixtures thereof.

The term surface coatings is taken to mean all surface coatings which are known to the person skilled in the art, such as, for example, automotive paints, industrial coatings, refinish paints and powder coatings.

Particularly suitable powder coatings are based on polyesters, epoxy resins, polyester epoxy resins (mixed powders), polyurethanes, acrylates and fluidised-bed sintering powders (polyamide-based).

In order to improve the introduction of color into the matrix of the plastic or of the powder coating, so-called carrier substances can be added to the colorant/absorber component. These significantly improve introduction into the surface of the plastic or powder coating, but do not remain as a constituent in the marking.

Suitable carriers are, for example, mineral oils, waxes, paraffins and nitrocellulose lacquers.

The proportion of carrier substance, based on the colorant/absorber component, is from 0.1 to 99.9% by weight, preferably from 10 to 90% by weight, in particular from 25 to 75% by weight.

In a particular embodiment, the colored marking of the plastics and powder coatings becomes even higher in contrast if the plastic or surface coating system to be inscribed is additionally doped with one or more laser light-absorbent substances. Introduction of the colorant into the surface of the system to be marked is then significantly improved.

The dopant in the plastic or surface coating may be identical to or different from the laser light-absorbent substance of the colorant/absorber component. Suitable laser-absorbent substances in the plastic or surface coating are, in particular, platelet-shaped transparent or semi-transparent substrates which are covered with one or more colored or colorless metal oxides. Particular preference is given to dopants based on mica substrates. These platelet-shaped pigments are known and are commercially available under the trade name Iriodin® LS from Merck KGaA.

The marking of the plastics and powder coatings is simple and easy to carry out. The colored marking is carried out predominantly in the plastic or powder-coating matrix, i.e. not by melting a further plastic or surface coating component. For application, the colorant/absorber component can be applied directly to the plastic or surface coating to be inscribed. The colorant/absorber component is applied to the surface of the system to be marked by conventional techniques, such as brushing, printing, spraying or knife coating. The layer thickness is generally from 0.1 to 10,000 nm, preferably from 10 to 5000 nm, in particular from 50 to 3000 nm. The introduction into the plastic surface is carried out directly by the laser beam focused on the plastic or coating surface. Depending on the colorant/absorber combinations employed, lasers having different wavelengths can be employed here, but use is preferably made of $CO_2$ lasers at a wavelength of 10.6 $\mu$m, and Nd:YAG lasers at 1064 nm. Finally, the surface of the marked system is freed from unconsumed colorant/absorber component by simple wiping-off.

The inscription with the laser is carried out by introducing the test specimen into the ray path of a pulsed laser, preferably a $CO_2$ or Nd:YAG laser. Furthermore, inscription using an excimer laser, for example by means of a mask technique, is possible. However, the desired results can also be achieved using other conventional types of laser which have a wavelength in a region of high absorption of the laser light-absorbent substance used. The marking obtained is determined by the irradiation time (or number of pulses in the case of pulsed lasers) and irradiation power of the laser and of the plastic system or surface coating system used. The power of the laser used is dependent on the particular application and can readily be determined in each individual case by the person skilled in the art.

The laser used generally has a wavelength in the range from 157 nm to 10.6 $\mu$m, preferably in the range from 532 nm to 10.6 $\mu$m. Mention may be made here, for example, of $CO_2$ lasers (10.6 $\mu$m) and Nd:YAG lasers (1064 or 532 nm) or pulsed UV lasers. The excimer lasers have the following wavelengths: $F_2$ excimer laser (157 nm), ArF excimer laser (193 nm), KrCl excimer laser (222 nm), KrF excimer laser (248 nm), XeCl excimer laser (308 nm), XeF excimer laser (351 nm), frequency-multiplied Nd:YAG lasers having wavelengths of 355 nm (frequency-tripled) or 265 nm (frequency-quadrupled). Particular preference is given to the use of Nd:YAG lasers (1064 or 532 nm) and $CO_2$ lasers. The energy densities of the lasers employed are generally in the range from 0.3 mJ/cm$^2$ to 50 J/cm$^2$, preferably from 0.3 mJ/cm$^2$ to 10 J/cm$^2$.

When pulsed lasers are used, the pulse frequency is generally in the range from 1 to 30 kHz. Corresponding lasers which can be employed in the process according to the invention are commercially available.

The plastic or surface coating according to the invention can be used in all areas where conventional printing processes have hitherto been employed for the inscription of plastics. For example, mouldings of the plastic according to the invention can be used in the electrical, electronics and motor vehicle industries. The labelling and inscription of, for example, cables, lines, trim strips or functional parts in the heating, ventilation and cooling area or switches, plugs, levers and handles which consist of the plastic according to the invention, can be carried out even in poorly accessible areas with the aid of laser light. Furthermore, the plastic system according to the invention can be employed in packaging in the foods sector or in the toys sector. The markings on the packaging are distinguished by the fact that they can be applied in such a manner that they are wipe- and scratch-resistant, stable during subsequent sterilisation processes and are hygienically pure during the marking process. Complete label images can be applied durably to the packaging for a re-usable system. A further important area of application for laser inscription comprises plastic tags for the individual identification of cattle, so-called cattle tags or ear tags. The information belonging specifically to the animal is stored via a bar code system. This information can be called up again when needed with the aid of a scanner. The inscription must be very durable since the tags in some cases remain on the animals for a number of years.

The surface coatings and powder coatings according to the invention can be used in the labelling of functional parts in the automobile and industrial sectors, in the electrical sector and on levers, handles, tools, metal plates, pipes, ceramic plates, packaging, plugs, grilles and component support parts.

The entire disclosure(s) of all applications, patents and publications, cited above or below, and of corresponding German Application No. 10136479.2, filed Jul. 27, 2001, are/is hereby incorporated by reference.

The following examples are intended to explain the invention, but without limiting it. The percentages indicated are percent by weight.

EXAMPLES

In the foregoing and in the following examples, all temperatures are set forth uncorrected in degrees Celsius; and, unless otherwise indicated, all parts and percentages are by weight.

Example 1

Injection mouldings are produced from a thermoplastic polypropylene (grade: PPH 10, DSM, Geelen) with 1% of titanium dioxide (Kronos) and 0.2% of Iriodin® LS 825 ((Sn, Sb)$O_2$-coated mica from Merck KGaA, Darmstadt).

The additives are added in the form of polypropylene concentrates before the injection-moulding operation. The injection mouldings exhibit a white body color under daylight. A mixture of a blue colored pigment (PV True Blue, Clariant) and a tin/antimony mixed oxide (Zelec ECP-3010-XC, Dupont Chemicals) in a mixing ratio of 2:8 is sprayed onto the surface of the injection mouldings using a commercially available air brush. For use in the air brush, the mixture is mixed in the ratio 1:1 with a mineral oil (Energol WM6 from BP Schmierstoff GmbH). The uniform color layer comprising colorant and laser absorber achieved after the spraying-on is introduced into the surface by means of a commercially available Nd:YAG laser (model Starkmark, Baasel Lasertechnik). The surface is then freed from color layer which has not been introduced by simple wiping-off. Blue, high-contrast inscriptions remain which are distinguished by high surface quality and very good abrasion resistance.

Example 2

Analogous to Example 1, but with a red colored pigment (PV True Red, Clariant) and a tin/antimony mixed oxide (Zelec ECP-3010-XC, Dupont Chemicals), in a mixing ratio of 3:7. Red, high-contrast inscriptions are obtained which are distinguished by high surface quality and very good abrasion resistance.

Example 3

Analogous to Example 2, but with a yellow colored pigment (PV True Yellow, Clariant) and a tin/antimony mixed oxide (Zelec ECP-3010-XC, Dupont Chemicals), in a mixing ratio of 1:9. Yellow, high-contrast inscriptions are obtained which are distinguished by high surface quality and very good abrasion resistance.

Example 4

Injection mouldings are produced from a thermoplastic polyamide (grade Schulamid, Schulmann) with 0.8% of Iriodin® LS 835 ($Fe_3O_4$-coated mica from Merck KGaA, Darmstadt). The additives are added in the form of concentrates in polyamide before the injection-moulding operation. The injection mouldings exhibit a black body color under daylight. The laser marking is carried out analogously to Example 1. A blue, high-contrast inscription is obtained which is distinguished by high surface quality and very good abrasion resistance.

Example 5

Metal articles are powder-coated with a powder coating based on polyester, with the powder coating containing 2% of Iriodine LS 820 (Merck KGaA). The laser marking is carried out analogously to Example 1. Blue, high-contrast inscriptions are obtained which are distinguished by high surface quality and very good abrasion resistance.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A color-inscribable or color-markable plastic or surface coating, which comprises a plastic or surface coating and, on a surface of the plastic or surface coating a separate colorant/absorber coating of a mixture comprising one or more colorants and one or more laser light-absorbent substances, which enables the plastic or surface coating to be color-inscribed or color-marked by applying laser light to the surface having the colorant/absorber coating.

2. A color-inscribable or color-markable plastic or surface coating according to claim 1, wherein the colorant:laser light-absorbent substance weight ratio in the colorant/absorber coating is from 100:10 to 10:100.

3. A color-inscribable or color-markable plastic or surface coating according to claim 1, wherein at least one colorant is a dye or an organic or inorganic pigment.

4. A color-inscribable or color-markable plastic or surface coating according to claim 2, wherein at least one colorant is a dye or an organic or inorganic pigment.

5. A color-inscribable or color-markable plastic or surface coating according to claim 3, wherein the colorant is selected from the group consisting of copper phthalocyanines, dioxazines, anthraquinones, monoazo and diazo pigments, diketopyrrolopyrrole, polycyclic pigments, anthrapyrimidines, quinacridones, quinaphthalones, perinones, perylenes, acridines, azo dyes, phthalocyanines, xanthenes, phenazines, colored oxide and oxide hydroxide pigments, oxide mixed-phase pigments, sulfide and sulfide/selenium pigments, carbonate pigments, chromate and chromate/molybdate mixed-phase pigments, complex-salt pigments and silicate pigments.

6. A color-inscribable or color-markable plastic or surface coating according to claim 1, which is a color-markable plastic that is a thermoplastic or a thermoset plastic.

7. A color-inscribable or color-markable plastic according to claim 6, wherein the plastic is a polyethylene, polypropylene, polyamide, polyester, polyester-ester, polyether-ester, polyphenylene ether, polyacetal, polybutylene terephthalate, polymethyl methacrylate, polyvinyl acetal, polystyrene, acrylonitrile-butadiene-styrene (ABS), acrylonitrile-styrene-acrylate (ASA), polycarbonate, polyether sulfone or polyether ketone, or a copolymer and/or mixture thereof.

8. A color-inscribable or color-markable plastic or surface coating according to claim 1, wherein the plastic or surface coating itself also comprises one or more laser light-absorbent substances.

9. A process for color inscribing or color marking of a plastic or surface coating, which comprises: covering at least the area of the plastic or surface coating to be inscribed or marked with a separate colorant/absorber coating of a mixture comprising one or more colorants and one or more laser light-absorbent substances, and transferring this layer completely or partially into the plastic or surface coating over part or all of the surface by applying laser light thereto.

10. The process of claim 9, wherein the laser light is from a $CO_2$ or Nd:YAG laser.

11. A plastic article or article having a surface coating which has been color inscribed or marked by the process of claim 9.

12. An article having a surface coating according to claim 11, wherein the surface coating is a powder coating.

13. A color-inscribable or color-markable plastic or surface coating according to claim 1, wherein the colorant:laser light-absorbent substance weight ratio in the colorant/absorber coating is from 95:5 to 20:80.

14. A color-inscribable or color-markable plastic or surface coating according to claim 1, wherein at least one laser light-absorbent substance is selected from the group consisting of anthracene, pentaerythritol, copper hydroxide phosphates, molybdenum disulfide, antimony(III) oxide, bismuth oxychloride, platelet-shaped substrates comprising phyllosilicates, synthetic or natural mica, talc, kaolin, glass platelets, $SiO_2$ platelets or synthetic support-free platelets, platelet-shaped metal oxides, liquid crystal polymers, holographic pigments, conductive pigments, coated graphite platelets, metal platelets, which can be uncoated or alternatively covered with one or more metal oxide layers.

15. A color-inscribable or color-markable plastic or surface coating according to claim 1, wherein at least one laser light-absorbent substance is selected from the group consisting of mica flakes coated with one or more metal oxides.

16. A color-inscribable or color-markable plastic or surface coating according to claim 1, wherein at least one laser light-absorbent substance is selected from the group consisting of anthracene, pentaerythritol, copper hydroxide phosphates, molybdenum disulfide, antimony(III) oxide and bismuth oxychioride.

17. A color-inscribable or color-markable plastic or surface coating according to claim 1, wherein the mixture comprising one or more colorants and one or more laser light-absorbent substances further comprises a carrier of at least one mineral oil, wax, paraffin or nitrocellulose lacquer.

18. The process of claim 9, further comprising removing the remaining mixture comprising one or more colorants and one or more laser light-absorbent substances which is not transferred to the plastic or surface coating by wiping it off.

19. A color-inscribable or color-markable plastic or surface coating according to claim 1, wherein the colorant results in a color-inscription or color-marking, after applying laser light, which is a visibly distinct color from any color of the plastic or surface coating.

20. A method according to claim 9, wherein the colorant results in a color-inscription or color-marking, after applying laser light, which is a visibly distinct color from any color of the plastic or surface coating.

* * * * *

UNITED STATES PATENT AND TRADEMARK OFFICE

CERTIFICATE OF CORRECTION

PATENT NO. : 6,924,077 B2
DATED : August 2, 2005
INVENTOR(S) : Reiner Delp et al.

It is certified that error appears in the above-identified patent and that said Letters Patent is hereby corrected as shown below:

Column 6,
Line 35, reads “surface coating a separate” should read -- surface coating, a separate --.

Column 8,
Line 16, reads “bismuth oxychioride.” should read -- bismuth oxychloride. --.

Signed and Sealed this

Twenty-first Day of March, 2006

JON W. DUDAS
*Director of the United States Patent and Trademark Office*